United States Patent [19]

Nagano

[11] Patent Number: 5,298,868
[45] Date of Patent: Mar. 29, 1994

[54] GAIN CONTROL AMPLIFIER

[75] Inventor: Yoshiaki Nagano, Itami, Japan

[73] Assignee: Mitsubishi Denki Kabushiki Kaisha, Tokyo, Japan

[21] Appl. No.: 956,983

[22] Filed: Oct. 6, 1992

[30] Foreign Application Priority Data

Mar. 30, 1992 [JP] Japan ................... 4-073716

[51] Int. Cl.$^5$ .............................................. H03G 3/20
[52] U.S. Cl. ...................................... 330/129; 330/133
[58] Field of Search ............... 330/129, 133, 150, 278, 330/279, 310

[56] References Cited

U.S. PATENT DOCUMENTS

3,969,683  7/1976  Fabricius ...................... 330/129 X
4,794,343  12/1988  Yang ............................. 330/129 X

OTHER PUBLICATIONS

Abstract of JO 2301-208-A, Dec. 13, 1990.
Abstract of JO 2305-030-A, Dec. 18, 1990.

*Primary Examiner*—Steven Mottola
*Attorney, Agent, or Firm*—Oblon, Spivak, McClelland, Maier & Neustadt

[57] ABSTRACT

A gain control amplifier is disclosed in which its gain changes continuously. Gain control amplifiers are connected in series between a signal input terminal and a signal output terminal. Each gain control amplifier is connected to an up-down counter via a D/A converter. A first up-down counter receives and counts gain control clocks, and increases the gain of a first gain control amplifier through a first D/A converter. When the up-down counter has registered a full count, the gain control clocks are input to a second up-down counter as a second output, during which the full count registered in the up-down counter is maintained as such. Thus, the gain of one gain control amplifier is increased only after the gain of the immediately preceding gain control amplifier has reached its maximum.

11 Claims, 7 Drawing Sheets

GAIN CONTROL AMPLIFIER

BACKGROUND OF THE INVENTION

1. Field of the Invention

The present invention relates to a gain control amplifier.

2. Description of the Background Art

FIG. 1 shows an example of a structure of a conventional gain control amplifier 100. A signal input terminal 1 is grounded through resistors 2, 3 and 4 which are connected in series and which have resistances R1, R2 and R3, respectively. A contact 6 is connected to a junction of the signal input terminal 1 and the resistor 2. A contact 7 is connected to a junction of the resistor 2 and the resistor 3 while a contact 8 is connected to a junction of the resistor 3 and the resistor 4.

The contacts 6 to 8 and an input terminal of a gain control amplifier 9 form a switch 5 which selects a contact for connection to the input terminal of the gain control amplifier 9. An output terminal of the gain control amplifier 9 is connected to a signal output terminal 11. A control input terminal of the gain control amplifier 9 is connected to a variable voltage source 10.

A signal received at the signal input terminal 1 is voltage-divided by the resistors 2, 3 and 4 so that voltage-divided signals are available at the contacts 6 to 8. One of the voltage-divided signals is admitted to the input terminal of the gain control amplifier 9 by the switch 5 and amplified with a predetermined gain. The gain of the gain control amplifier 9 is responsive to a potential given to the control input terminal of the gain control amplifier 9; that is, the gain of the gain control amplifier 9 is controlled by increasing or decreasing a voltage supplied by the variable voltage source 10. Hence, the gain of the gain control amplifier 100 is roughly controlled by the switch 5 which selects one of the signals which are voltage-divided by the resistors 2 to 4 and finely controlled by the variable voltage source 10.

The gain control amplifier 100 inherently has a weakness that its gain does not always make a continuous change in response to a voltage generated in the variable voltage source 10. FIG. 2 is a graph of a voltage at the variable voltage source 10 versus the gain of the gain control amplifier 100. The characteristic curves 12, 13 and 14 represent voltage/amplification-degree relations of where the switch 5 selects the contacts 6, 7 and 8 for connection to the input terminal of the gain control amplifier 9, respectively.

As is evidenced in FIG. 2, the gain of the gain control amplifier 100, which is dependent on a voltage at the variable voltage source 10, changes discontinuously at around values G1 and G2 due to switching action of the switch 5. Further, it is impossible to make the characteristics represented by the characteristic curves 12 to 14 different from each other since the gain control amplifier 9 alone amplifies the signals independently of the switching behavior of the switch 5.

SUMMARY OF THE INVENTION

A gain control amplifier of a first aspect of the present invention comprises: an input terminal; an output terminal; first to N-th amplifiers each having an input terminal, an output terminal and a control terminal where N being an integer satisfying $N \geq 2$; and control means which provides the control terminals of the first to the N-th amplifiers with a potential which causes one of the first to the N-th amplifiers to vary its gain only when the gains of the other amplifiers are maximum or minimum wherein the first to the N-th amplifiers are connected in series between the input terminal and the output terminal; and the gains of the first to the N-th amplifiers are determined by a potential received at the control terminals of the first to the N-th amplifiers.

The control means may comprise: first to N-th up-down counters which correspond to the first to the N-th amplifiers, each of the first to the N-th up-down counters having a first input terminal, a second input terminal, a first output terminal and a second output terminal; and first to N-th D/A converters which correspond to the first to the N-th amplifiers. Each D/A converter is connected between the control terminal of the associated amplifier and the first output terminal of the associated up-down counter. A count control clock is given in common to the first input terminals of the first to the N-th up-down counters. Whether the first to the N-th up-down counters each count up or count down is determined by the count control clock. Each up-down counter counts signals received at its second input terminal and outputs an original control signal at its first output terminal, and only when a count registered therein and represented by the original control signal becomes a full count, passes signals received at its second input terminal to its second output terminal while maintaining the original control signal as representing the full count. Count clocks are given to the second input terminal of the first up-down counter. The second input terminal of a K-th up-down counter is connected to the second output terminal of a $(K-1)$-th up-down counter where K being an integer satisfying $2 \leq K < N$. Each D/A converter D/A converts the original control signal given from a respective one of the first to the N-th up-down counters and generates a control signal, and thereafter inputs the control signal to the control terminal of a respective one of the first to the N-th D/A amplifiers.

In a preferred aspect, the gains of the first to the N-th D/A amplifiers each change linearly with a change in the control signal.

In a preferred aspect, changes in the gains of the first to the N-th D/A amplifiers as a function of the control signal are identical.

In a further preferred aspect, the gain of at least one of the first to the N-th D/A amplifiers changes differently from those of the other amplifiers as a function of the control signal.

The gain control amplifier may further comprise an A/D converter which is connected to the output terminal of the gain control amplifier and which A/D converts an output from the N-th amplifier. The count control clock may be an overflow clock from the A/D converter.

In a still further preferred aspect, the first to the N-th up-down counters count down when the count control clock is at a high level and count up when the count control clock is at a low level.

If the gain of the gain control amplifier is to decrease, the control means increases the gain of the amplifier which has not reached its maximum gain.

Hence, it is possible that the gain of the gain control amplifier changes continuously. Fine control of the gain is possible when the gain reaches a certain value while rough control of the gain is possible when the gain reaches another certain value.

A gain control amplifier of a second aspect of the present invention comprises: an input terminal; an output terminal; a plurality of amplifiers connected in series between the input terminal and the output terminal, each one of the amplifiers having an input terminal, an output terminal and a control terminal, the gains of the amplifiers being determined by a potential impressed to the control terminals of the amplifiers; and control means for providing the amplifiers with a potential which causes the gains of the amplifiers to increase or decrease at the same time.

In a preferred aspect, the control means comprises: an up-down counter having a first input terminal, a second input terminal and an output terminal; and a D/A converter, an output terminal of the D/A converter being connected in common to the control terminals of all the amplifiers, an input terminal of the D/A converter being connected to the output terminal of the up-down counter. The up-down counter receives at its first input terminal a count control clock which determines whether the up-down counter counts up or counts down, receives count clocks at its second input terminal; counts the count clocks and outputs an original control signal to its output terminal. The D/A converter D/A converts the original control signal and outputs a control signal at its output terminal.

Thus, when an increase in the gain of the gain control amplifier is desired, the control means controls all the amplifiers so that the gains of the amplifiers increase at the same time. If the gain of the gain control amplifier is to decrease, the control means controls all the amplifiers so that the gains of the amplifiers decrease at the same time.

It is possible to finely control the gain of the gain control amplifier when the gain of the gain control amplifier is relatively low, and to roughly control the gain of the gain control amplifier when the gain of the gain control amplifier is relatively high.

A gain control amplifier of a third aspect of the present invention comprises: an input terminal; an output terminal; first to N-th amplifiers each having an input terminal, an output terminal and a control terminal where N being an integer satisfying $N \geq 2$; and control means which generates first to N-th control signals which independently control the gains of the first to the N-th amplifiers and which provides the first to the N-th amplifiers with the first to the N-th control signals. The control means comprises: first to N-th up-down counters which correspond to the first to the N-th amplifiers, each of the first to the N-th up-down counters having a first input terminal, a second input terminal and an output terminal; and first to N-th D/A converters which correspond to the first to the N-th amplifiers. Each D/A converter has an input terminal which is connected to the output terminal of the associated up-down counter, and an output terminal which is connected to the control terminal of the associated amplifier. Where K being an integer satisfying $2 \leq K \leq N$, a K-th up-down counter: receives at the first input terminal a K-th count control clock which determines whether the K-th counter counts up or counts down; receives a K-th count clock at the second input terminal; and counts the K-th count clock and outputs a K-th original control signal at its output terminal, and a K-th D/A converter D/A converts the K-th original control signal and outputs a K-th control signal at its output terminal.

In a preferred aspect, the gain of at least one of the first to the N-th D/A amplifiers changes differently from the other amplifiers as a function of the control signal.

In a preferred aspect, the gains of the first to the N-th D/A amplifiers change linearly with a change in the control signal and differently from each other.

Thus, the D/A converters and the up-down counters independently control the gains of the associated amplifiers.

Hence, it is possible to control the gain of the gain control amplifier so that output signals from the gain control amplifier are approximately constant.

Accordingly, it is an object of the present invention to obtain a gain control amplifier which has a gain which varies continuously and which can have diverse control characteristics.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
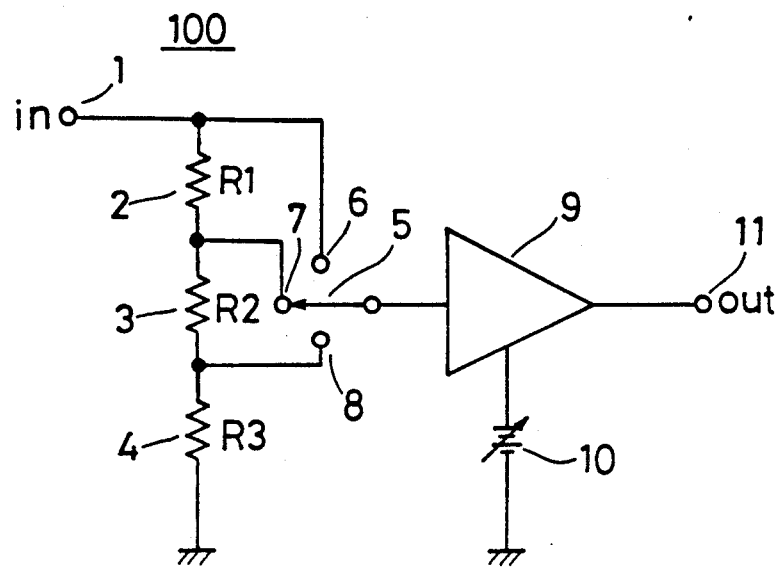
FIG. 1 is a block diagram showing a conventional gain control amplifier.
Figure 2:
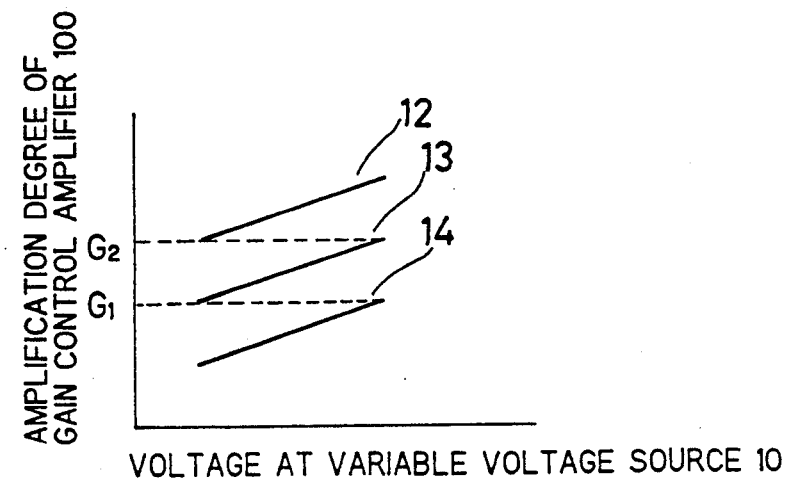
FIG. 2 is a graph showing operations of the conventional gain control amplifier.
Figure 3:
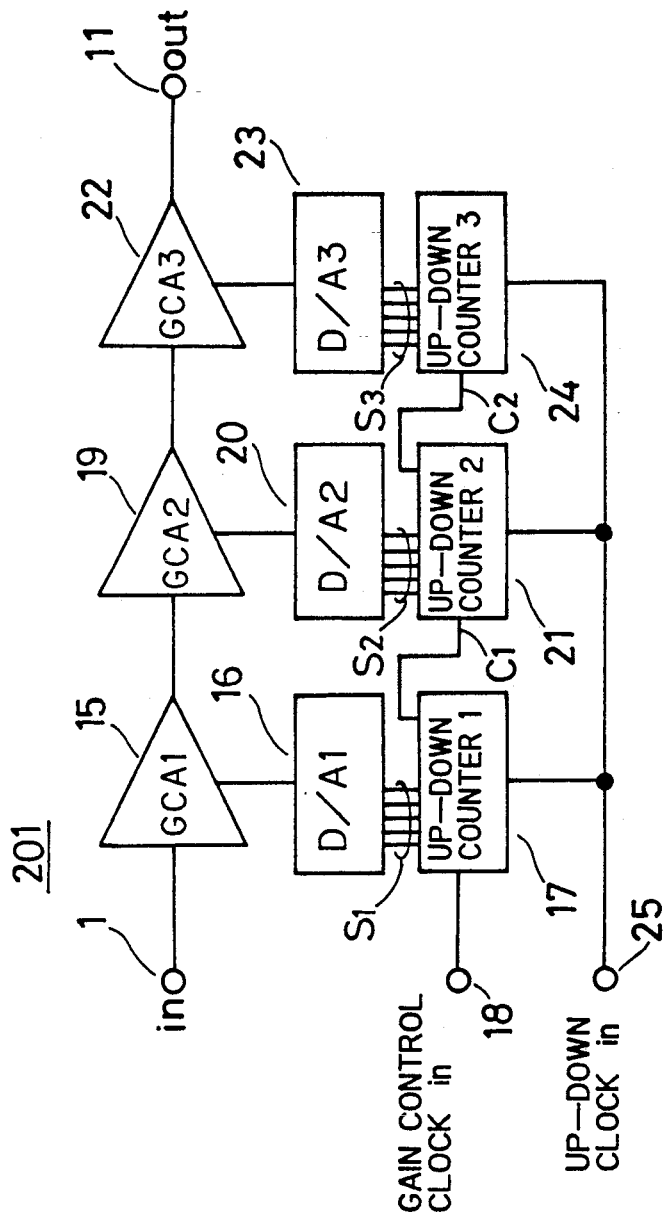
FIG. 3 is a block diagram showing a circuit according to a first preferred embodiment of the present invention.

FIG. 3 is a block diagram of a gain control amplifier 201 according to a first preferred embodiment of the present invention. A first gain control amplifier 15 (GCA1), a second gain control amplifier 19 (GCA2) and a third gain control amplifier 22 (GCA3) are connected in series in this order between a signal input terminal 1 and a signal output terminal 11.

Outputs from a first D/A converter 16 (D/A1), a second D/A converter 20 (D/A2) and a third D/A converter 23 (D/A3) are coupled to control input terminals of the first, the second and the third gain control amplifiers 15, 19 and 22, respectively.

Output $S_1$ from a first up-down counter 17 is input to the first D/A converter 16. Likewise, output $S_2$ from a second up-down counter 21 is input to the second D/A converter 20 while output $S_3$ from a third up-down counter 24 is input to the third D/A converter 23.

A clock input terminal of the first up-down counter 17 is connected to a clock signal input terminal 18. outputs $C_1$ and $C_2$ from the first and the second up-down counters 17 and 21 are coupled to clock input terminals of the second and the third up-down counters 21 and 24, respectively. Counting direction control terminals of the first, the second and the third up-down counters 17, 21 and 24 are commonly connected to a control signal input terminal 25. The signal input terminal 1 receives an original signal. The clock signal input terminal 18 receives a gain control clock and the control signal input terminal 25 receives an up-down clock.

The original signal is amplified with the gain (hereinafter in decibels) of the gain control amplifier 201, which is a sum of the gains of the first, the second and the third gain control amplifiers 15, 19 and 22, and is outputted at the signal output terminal 11.

In the first preferred embodiment, the gain of the first gain control amplifier 15 is increased first, that of the second gain control amplifier 19 is increased next, and that of the third gain control amplifier 22 is increased at last until a desired gain of the gain control amplifier 201 is reached. To decrease the gain of the gain control amplifier 201, the gains of the first, the second and the third amplifiers 15, 19 and 22 are decreased in the reverse order of the increase of the gain.

This will be explained in more detail by taking the case where the first, the second and the third gain control amplifiers 15, 19 and 22 are set at their minimum gains as an example. If a desired gain of the gain control amplifier 201 is larger than a sum of the gains of the first, the second and the third gain control amplifiers 15, 19 and 22, the gain of the first gain control amplifier 15 starts to increase. More precisely, up-down clocks are given to the first, the second and the third up-down counters 17, 21 and 24 so as to set the up-down counters to count up. Next, gain control clocks are supplied to the first up-down counter 17 one after another and counted therein. A count registered by the first up-down counter 17 is given to the first D/A converter 16 as the first output $S_1$. The second output $C_2$ has not been given to the second up-down counter 21 yet at this stage. The first output $S_1$ in digital form is converted into an analog signal in the first D/A convertor 16 and transmitted to the control input terminal of the first gain control amplifier 15.

Thus, the gain of the gain control amplifier 201 initially increases with an increase in the gain of the first gain control amplifier 15.

If the operation as above has yielded the desired gain of the gain control amplifier 201, supply of the gain control clocks is cut off. On the contrary, if the desired gain has not been reached even with the first output $S_1$ representing that the first up-down counter 17 has registered a full count, the gain control clock is given to the second up-down counter 21 as the second output $C_1$ while the first output $S_1$ continues to represent the full count registered at the first up-down counter 17. The second output $C_1$ makes the second up-down counter 21 count as the first up-down counter 17 does. Thus, the gain of the second gain control amplifier 19 increases in accordance with the first output $S_2$ obtainable at the second D/A converter 20.

In other words, the gain of the second gain control amplifier 19 starts increasing only after the gain of the first gain control amplifier 15 has reached its maximum. The same is true of the relationship between the gains of the second and the third gain control amplifiers 19 and 22. If the desired gain of the gain control amplifier 201 has not been attained even though the second gain control amplifier 19 has reached its maximum gain, the gain control clock is given to the third up-down counter 24 as the second output $C_2$ while the second up-down counter 21 registers a full count and outputs the first output $S_2$ which represents such. In response to this, the third up-down counter 24 starts counting. Thus, the gain of the third gain control amplifier 22 increases in accordance with the first output $S_3$.

The gain control clocks overflown from the first and the second up-down counters 17 and 21 may be used as the second outputs $C_1$ and $C_2$, respectively.

Figure 4:
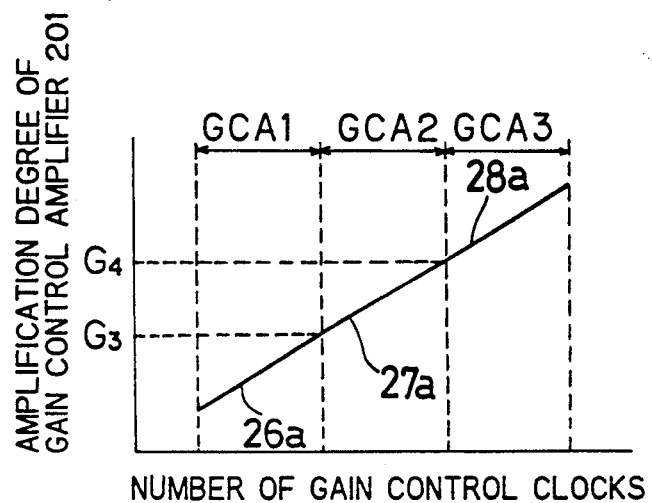
FIGS. 4 and 5 are graphs showing operations of the circuit of FIG. 3.

Thus, the gain of the gain control amplifier 201 increases as the gain control clocks supplied to the up-down counters increase in number, i.e., as a clock count increases. FIG. 4 is a graph plotting the gain of the gain control amplifier 201 against the number of the gain control clocks. The characteristic curves 26a, 27a and 28a represent control characteristic seen in the ranges in which the gain of the gain control amplifier 201 is controlled by a change in the gains of the first, the second and the third the gain control amplifiers 15, 19 and 22, respectively. As described above, where the gain of the gain control amplifier 201 is increased by increasing the clock count, the gains of the second and the third the gain control amplifiers 19 and 22 would not increase unless the first and the second gain control amplifiers 15 and 19 reach their maximum gains, respectively. Hence, the gain of the gain control amplifier 201 continuously changes both at a value G3, which is recorded when the gain of the first gain control amplifier 15 has reached its maximum, and at a value G4, which is recorded when the gains of the second and the third gain control amplifiers 19 and 22 have reached their maximum.

On the other hand, if a decrease in the gain of the gain control amplifier 201 is desired, the up-down clocks set the first, the second and the third up-down counters 17, 21 and 24 to count down. In this case, an increasing clock count causes the gain of the gain control amplifier 201 to decrease. Hence, the gain of the pain control amplifier 201 changes continuously.

When the gains of the first, the second and the third gain control amplifiers 15, 19 and 22 plotted against the clock counts of the gain control clocks change at the same angle (i.e., the gain control amplifiers 15, 19 and 22 have the same control characteristics), the characteristic curves 26a, 27a and 28a are on the same line as shown in FIG. 4. In addition, even when the control characteristics of the gain control amplifiers 15, 19 and 22 are different from each other, the gain of the gain control amplifier 201 changes continuously as a function of the clock count.

Figure 5:
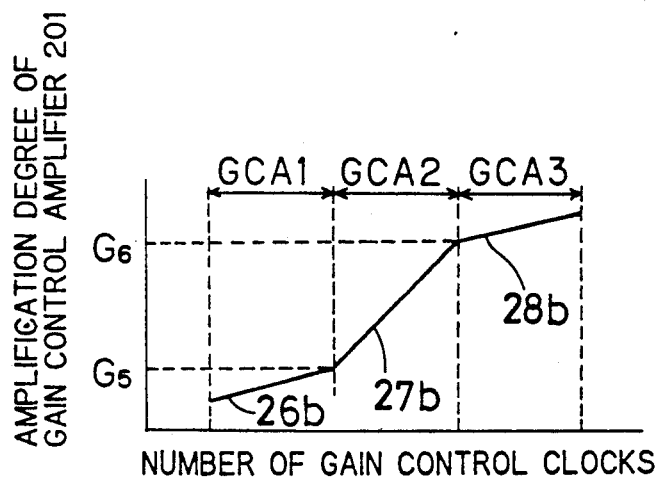

FIG. 5 shows the respective control characteristics of the first, the second and the third the gain control amplifiers 15, 19 and 22. The graph represents where the characteristic curve of the second gain control amplifier 19 is inclined at a larger angle than those of the first and the third gain control amplifiers 15 and 22. As clearly seen in the graph, fine control is possible in the range under the gain G5, rough control is possible in the range between the gains G5 and G6, and fine control is possible again in the range above the gain G6.

As heretofore described, by connecting a plurality of gain control amplifiers in series, it is possible to control the gain of the gain control amplifier as a whole so that it changes continuously. It is also possible that the control characteristic of the gain control amplifier as a whole has a diverse nature if the gain control amplifiers connected in series have different control characteristics.

Although the first preferred embodiment requires that three gain control amplifiers are connected in series, the effects as above are equally promised if the number of the gain control amplifiers is two or more than three.

Figure 6:
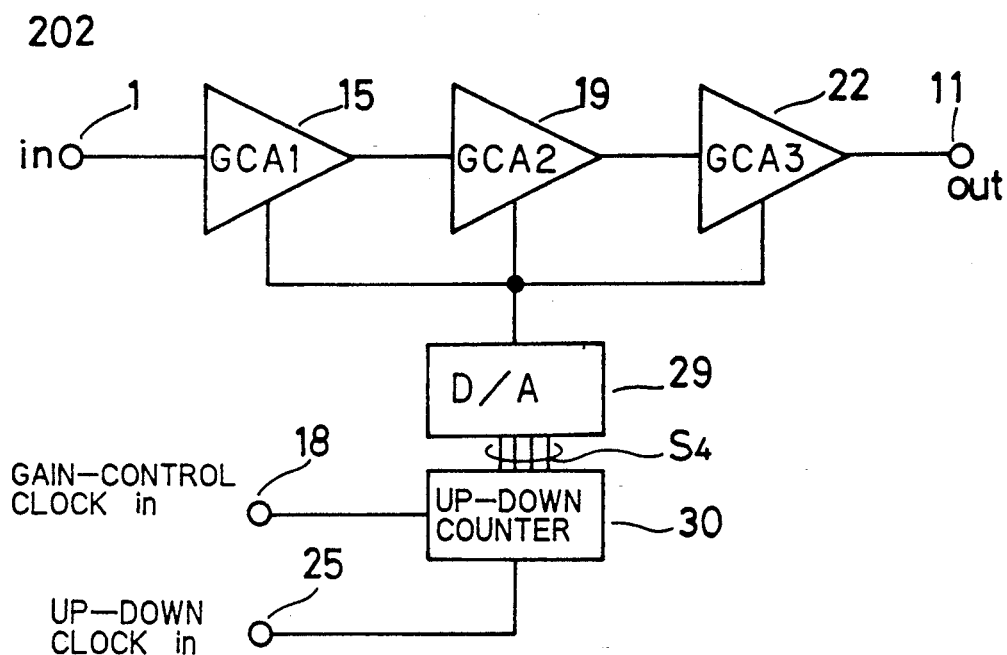
FIG. 6 is a block diagram showing a circuit according to a second preferred embodiment of the present invention.

FIG. 6 is a block diagram of a gain control amplifier 202 according to a second preferred embodiment of the present invention. The first, the second and the third the gain control amplifiers 15, 19 and 22 are connected in series between the signal input terminal 1 and the signal output terminal 11. The control input terminals of the first, the second and the third gain control amplifiers 15, 19 and 22 receive an output from a D/A converter 29. The D/A converter 29 is to receive at its input terminal an output $S_4$ from an up-down counter 30 which has a clock input terminal connected to the clock signal input terminal 18. A clock input terminal of the up-down counter 30 is connected to the control signal input terminal 25.

The second preferred embodiment is similar to the first preferred embodiment in that the up-down clock is coupled to the control signal input terminal 25 and the gain control clocks are coupled to the clock signal input terminal 18. The up-down clock determines whether the up-down counter 30 counts up or down, and the gains of the first, the second and the third the gain control amplifiers 15, 19 and 22 increase or decrease as a function of the clock count of the gain control clocks, which are also the same as in the first preferred embodiment.

Figure 7:
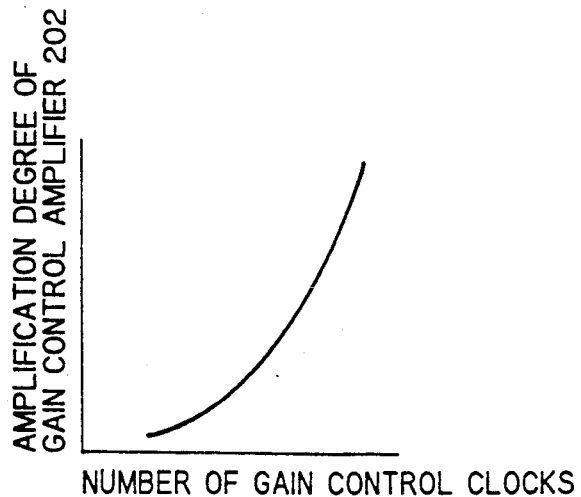
FIG. 7 is a graph showing operations of the circuit of FIG. 6.

Differently from the first preferred embodiment, is the feature that even if the first, the second and the third gain control amplifiers 15, 19 and 22 have the same control characteristics, the characteristic curve of the gain control amplifier 202 does not change linearly with a change in the clock count of the gain control clocks. Hence, fine control is possible when the gain of the gain control amplifier 202 is relatively low and rough control is possible when the gain of the gain control amplifier 202 is relatively high (FIG. 7).

Figure 8:
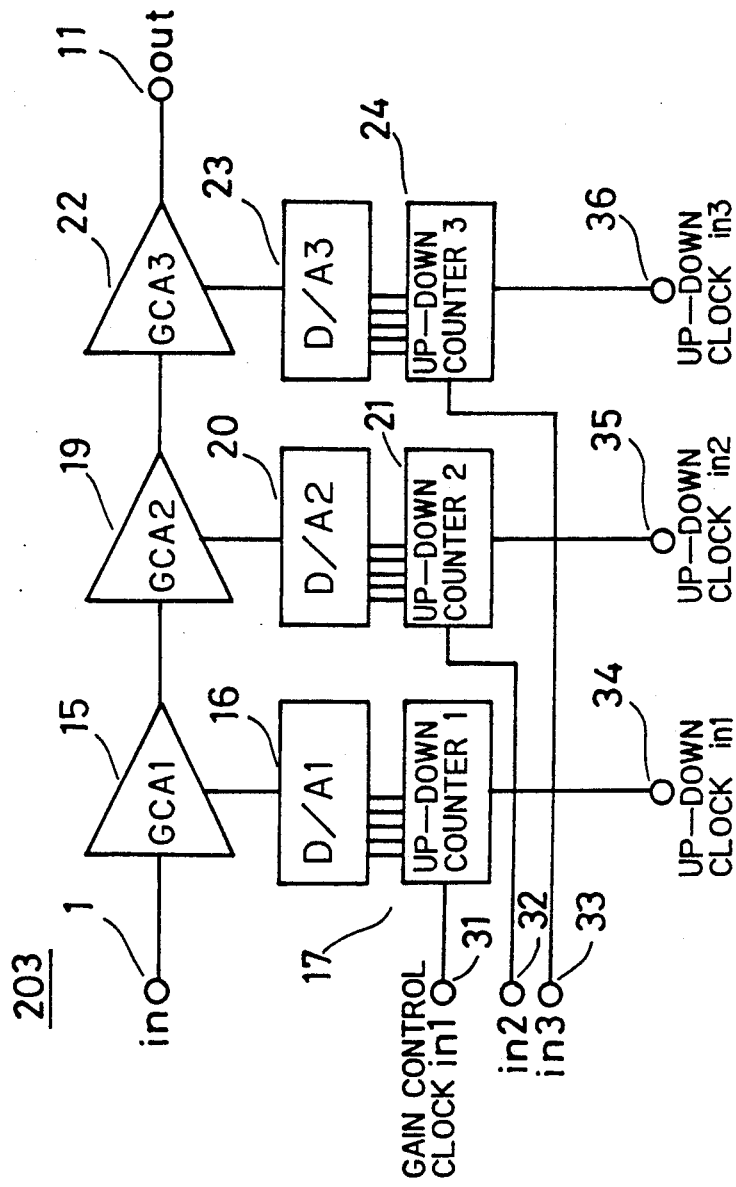
FIG. 8 is a block diagram showing a circuit according to a third preferred embodiment of the present invention.

FIG. 8 is a block diagram of a gain control amplifier 203 according to a third preferred embodiment of the present invention. Similarly to the first preferred embodiment, the first, the second and the third the gain control amplifiers 15, 19 and 22 are connected in series between the signal input terminal 1 and the signal output terminal 11. The first, the second and the third up-down counters 17, 21 and 24 are connected to the first, the second and the third the gain control amplifiers 15, 19 and 22 via the first, the second and the third D/A converters 16, 20 and 23, respectively.

The third preferred embodiment is different from the first preferred embodiment in that the first, the second and the third up-down counters 17, 21 and 24 have first, second and third control input terminals 34, 35 and 36 and first, second and third clock signal input terminals 31, 32 and 33, respectively. Hence, the up-down counters 17, 21 and 24 are independently controlled as to whether they count up or down and as to clocks they are to receive.

Figure 9A:
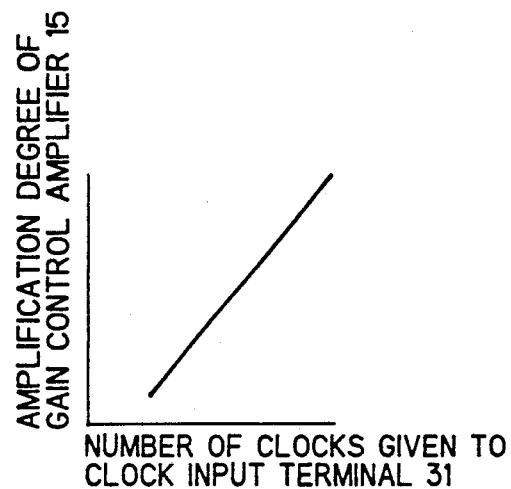
FIGS. 9A to 9C are graphs showing operations of the circuit of FIG. 8.
Figure 9B:
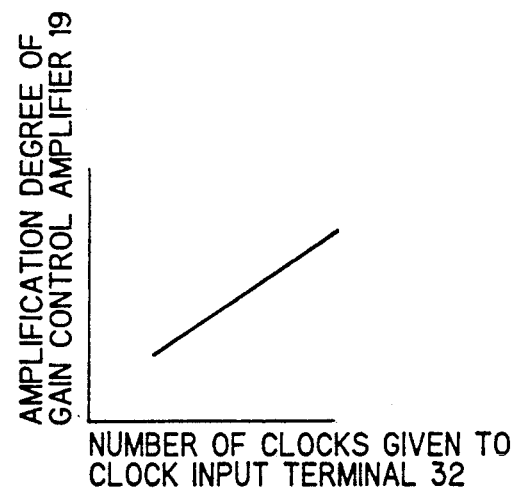
Figure 9C:
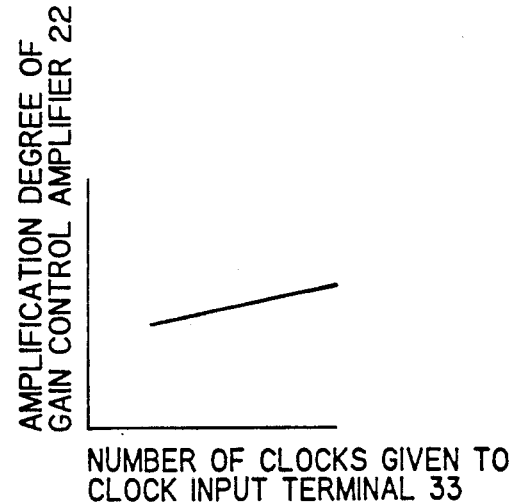

Assume that the first, the second and the third gain control amplifiers 15, 19 and 22 have different control characteristics as shown in FIGS. 9A to 9C. In this case, the gain of the gain control amplifier 203 is roughly controlled by increasing or decreasing the gain of the first gain control amplifier 15. Then, the gain of the gain control amplifier 203 is finely controlled by increasing or decreasing the gains of the second and the third gain control amplifiers 19 and 22 in this order. It is also possible to vary a time required for the gain of the gain control amplifier 203 to reach a desired value by changing which one of the first, the second and the third the gain control amplifiers 15, 19 and 22 to be put under control.

Figure 10:
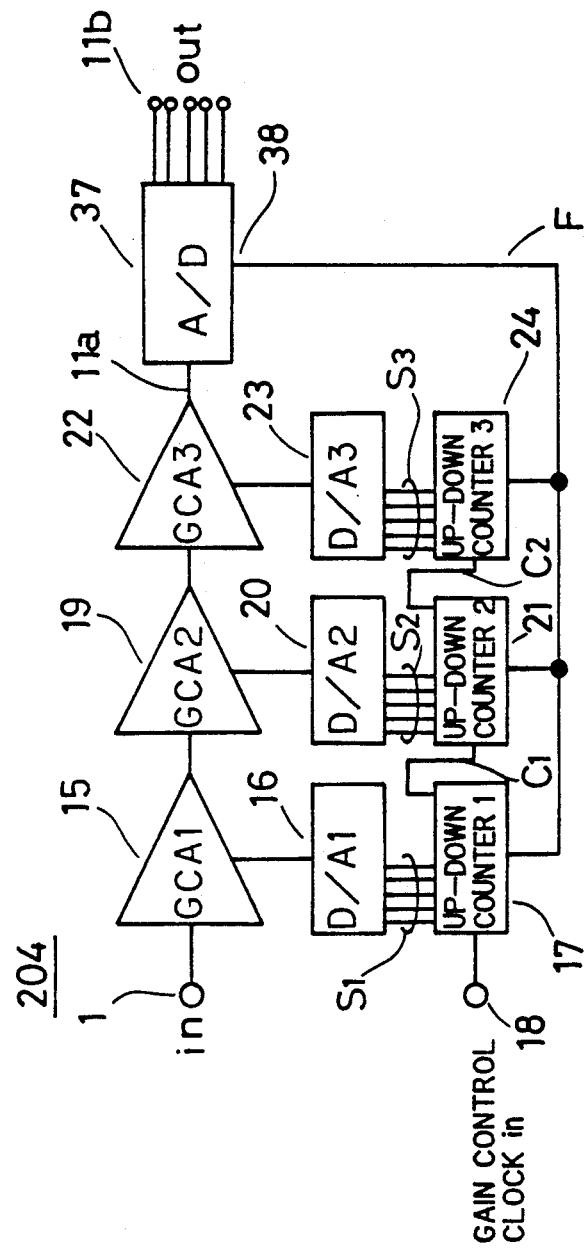
FIG. 10 is a block diagram showing a circuit according to a modification of the present invention.

FIG. 10 is a block diagram of a gain control amplifier 204 according to a modification of the present invention. Although generally similar in structure to the gain control amplifier 201 of the first preferred embodiment, the gain control amplifier 204 is different from the gain control amplifier 201 in that the output terminal of the third gain control amplifier 22 is connected to an input terminal 11a of an A/D converter 37, rather than directly to the signal output terminal 11. An original signal is amplified in the gain control amplifier 204 and outputted as a digital signal at output terminals 11b of the A/D converter 37. The A/D converter 37 has an overflow output terminal 38 which is connected to the counting direction control terminals of the first, the second and the third up-down counters 17, 21 and 24. The control signal input terminal 25 required in the first preferred embodiment is simply omitted in the gain control amplifier 204.

Due to the structure as above, the gain control amplifier 204 controls counting directions of the up-down counters 17, 21 and 24 in a different manner from the first preferred embodiment. The operation of the gain control amplifier 204 is otherwise the same as that of the gain control amplifier 201 of the first preferred embodiment. An original signal received at the signal input terminal 1 is amplified in the first, the second and the third the gain control amplifiers 15, 19 and 22. If the amplified signal is within the conversion range of the A/D converter 37, the A/D converter 37 does not release an overflow signal F so that the first, the second and the third up-down counters 17, 21 and 24 keep counting up. The gain control clocks are continuously inputted to the clock signal input terminal 18, thereby increasing the gain of the gain control amplifier 204.

If the amplified signal becomes so large that the A/D converter 37 cannot convert it, the overflow signal F is outputted at the overflow output terminal 38. Responding to the overflow signal F, the first, the second and the third up-down counters 17, 21 and 24 start counting down this time. Because of a continued supply of the gain control clocks to the clock signal input terminal 18 independently of this change in the counting direction, the gain of the gain control amplifier 204 decreases.

This causes the amplified signal to fall within the conversion range of the A/D converter 37 again. In response, supply of the overflow signal F is cut off, requiring that the first, the second and the third up-down counters 17, 21 and 24 start counting up once again. As a result, the gain of the gain control amplifier 204 turns to an increase again.

Since the gain control amplifier 204 operates in such a manner, digital signals available at the output terminals 11b stay at an approximately constant value.

While the invention has been shown and described in detail, the foregoing description is in all aspects illustrative and not restrictive. It is understood that numerous modifications and variations can be devised without departing from the scope of the invention.

I claim:

1. A gain control amplifier, comprising:
   an input terminal;
   an output terminal;

first to N-th amplifiers each having an input terminal, an output terminal, and a control terminal, where, N is an integer satisfying $N \geq 2$; and control means which provides said control terminals of said first to said N-th amplifiers with a potential which causes one of said first to said N-th amplifiers to vary its gain only when the gains of the other amplifiers are at a maximum or at a minimum, wherein said first to said N-th amplifiers are connected in series between said input terminal and said output terminal; and the gains of said first to said N-th amplifiers are determined by a potential received at said control terminals of said first to said N-th amplifiers.

2. The gain control amplifier of claim 1, wherein said control means comprises:

first to N-th up-down counters which correspond to said first to said N-th amplifiers, each of said first to said N-th up-down counters having a first input terminal, a second input terminal, a first output terminal and a second output terminal; and first to N-th D/A converters which correspond to said first to said N-th amplifiers, each of said first to said N-th D/A converters being connected between said control terminal of a corresponding one of said first to said N-th amplifiers and said first output terminal of corresponding one of said first to said N-th up-down counters, and wherein a count control clock is given in common to said first input terminals of said first to said N-th up-down counters;

whether said first to said N-th up-down counters each count up or count down being determined by said count control clock;

each one of said first to said N-th up-down counters counting signals received at its second input terminal and outputting an original control signal at its first output terminal;

each one of said first to said N-th up-down counters passing signals received at its second input terminal to its second output terminal only when a count registered therein and represented by said original control signal becomes a full count while maintaining said original control signal as representing said full count;

count clocks being given to said second input terminal of said first up-down counter;

said second input terminal of a K-th up-down counter being connected to said second output terminal of a (K−1)-th up-down counter where K is an integer satisfying $2 \leq K \leq N$; and each one of said first to said N-th D/A converters D/A converting said original control signal input from a respective one of said first to said N-th up-down counters and generating a control signal, and thereafter supplying said control signal to said control terminal of a respective one of said first to said N-th D/A amplifiers.

3. The gain control amplifier of claim 2, wherein the gains of said first to said N-th D/A amplifiers each change linearly with a change in said control signal.

4. The gain control amplifier of claim 3, wherein changes in the gains of said first to said N-th D/A amplifiers as a function of said control signal are identical.

5. The gain control amplifier of claim 3, wherein the gain of at least one of said first to said N-th D/A amplifiers changes differently from those of the other amplifiers as a function of said control signal.

6. The gain control amplifier of claim 2, further comprising an A/D converter which is connected to said output terminal of said gain control amplifier and which A/D converts an output from said N-th amplifier, wherein said count control clock is an overflow clock from said A/D converter.

7. The gain control amplifier of claim 6, wherein said first to said N-th up-down counters count down when said count control clock is at a high level and count up when said count control clock is at a low level.

8. A gain control amplifier, comprising:

an input terminal;

an output terminal;

a plurality of amplifiers connected in series between said input terminal and said output terminal, each one of said amplifiers having an input terminal, an output terminal, and a control terminal, the gains of said amplifiers being determined by a potential applied to said terminals of said amplifiers; and control means for providing said amplifiers with said potential which causes the gains of said amplifiers to increase or decrease simultaneously;

wherein said control means comprises:

an up-down counter having a first input terminal, a second input terminal, and an output terminal; and a D/A converter, an output terminal of said D/A converter being connected in common to said control terminals of all of said amplifiers, an input terminal of said D/A converter being connected to said output terminal of said up-down counter, said up-down counter receiving at its first input terminal a count control clock which determines whether said up-down counter counts up or counts down;

receiving count clocks at its second input terminal; and counting said count clocks and outputting an original control signal to its output terminal, and said D/A converters D/A converting said original control signal and outputting a control signal at its output terminal.

9. A gain control amplifier, comprising:

an input terminal;

an output terminal;

first to N-th amplifiers each having an input terminal, an output terminal, and a control terminal where N is an integer satisfying $N \geq 2$; and control means which generates first to N-th control signals which independently control the gains of said first to said N-th amplifiers and which provides said first to said N-th amplifiers with said first to said N-th control signals, wherein said control means comprises:

first to N-th up-down counters which correspond to said first to said N-th amplifiers, each of said first to said N-th up-down counters having a first input terminal for receiving a count control clock signal which determines whether a given up-down counter counts up or counts down, a second input terminal for receiving a count clock signal, and an output terminal for outputting an original control signal; and first to N-th D/A converters which correspond to said first to said N-th amplifiers, each of said first to said N-th D/A converters having an input terminal which is connected to said output terminal of a respective one of said first to said N-th up-down counters, and an output terminal which is connected to said control terminal of a respective one of said first to said N-th amplifiers.

10. The gain control amplifier of claim 9, wherein the gain of at least one of said first to said N-th D/A amplifiers changes differently from those of the other amplifiers as a function of said control signal.

11. The gain control amplifier of claim 10, wherein the gains of said first to said N-th D/A amplifiers change linearly with a change in said control signal and differently from each other.

* * * * *